United States Patent
Amdahl

(10) Patent No.: US 9,936,601 B2
(45) Date of Patent: Apr. 3, 2018

(54) CABLE MANAGEMENT ASSEMBLY FOR RACK MOUNTED EQUIPMENT

(71) Applicant: Sanmina Corporation, San Jose, CA (US)

(72) Inventor: Paul Orin Amdahl, Monument, CO (US)

(73) Assignee: Sanmina Corporation, San Jose, CA (US)

( * ) Notice: Subject to any disclaimer, the term of this patent is extended or adjusted under 35 U.S.C. 154(b) by 45 days.

(21) Appl. No.: 15/224,537

(22) Filed: Jul. 30, 2016

(65) Prior Publication Data

US 2017/0034944 A1     Feb. 2, 2017

Related U.S. Application Data

(60) Provisional application No. 62/199,164, filed on Jul. 30, 2015.

(51) Int. Cl.
*F16L 3/22* (2006.01)
*H05K 7/14* (2006.01)

(52) U.S. Cl.
CPC .................... *H05K 7/1491* (2013.01)

(58) Field of Classification Search
USPC ........................................................ 248/68.1
See application file for complete search history.

(56) References Cited

U.S. PATENT DOCUMENTS

| | | | |
|---|---|---|---|
| 6,427,952 B2* | 8/2002 | Caveney | F16L 3/23 248/68.1 |
| 7,026,553 B2* | 4/2006 | Levesque | H02G 3/0493 174/100 |
| 7,298,619 B1* | 11/2007 | Malone | H05K 7/1421 165/80.2 |
| 8,464,984 B2* | 6/2013 | Laursen | H02G 3/30 211/26 |

(Continued)

FOREIGN PATENT DOCUMENTS

EP     0644440     3/1995

OTHER PUBLICATIONS

International Search Report & Written Opinion for PCT/US2016/044933 dated Dec. 1, 2016; 5 pages.

*Primary Examiner* — Monica E Millner
(74) *Attorney, Agent, or Firm* — Loza & Loza, LLP; Julio Loza

(57) ABSTRACT

A cable management assembly for managing cabling of equipment is provided. The cable management assembly may be utilized to manage the movement of cables attached to the enclosures when the enclosures are pulled into and out of the front of a structure during servicing. The cable management assembly may comprise one or more detachable cable support members that form a helix having a first attachment end and a second attachment end. The first attachment end may be attached to an enclosure and the second attachment end may be attached to a rear back plate assembly. The detachable cable support members include a (Continued)

plurality of flat segments having a generally elongated planar configuration or a curved configuration. A combination of planar and curved segments may be secured together forming a loop. A plurality of loops may be secured together forming the assembly.

18 Claims, 13 Drawing Sheets

(56) References Cited

U.S. PATENT DOCUMENTS

| | | | |
|---|---|---|---|
| 8,985,530 B2* | 3/2015 | Jette | H02G 3/0443 248/49 |
| 2005/0111810 A1* | 5/2005 | Giraud | G02B 6/4452 385/135 |
| 2007/0258212 A1 | 11/2007 | Malone et al. | |
| 2010/0172083 A1 | 7/2010 | Randall et al. | |
| 2010/0200707 A1* | 8/2010 | Garza | H02G 3/0456 248/68.1 |
| 2015/0131957 A1* | 5/2015 | Gilbreath | F16L 3/06 385/135 |

* cited by examiner

CABLE MANAGEMENT ASSEMBLY FOR RACK MOUNTED EQUIPMENT

CLAIM OF PRIORITY

The present Application for Patent claims priority to U.S. Provisional Application No. 62/199,164 entitled "Cable Management Assembly for Rack Mounted Equipment", filed Jul. 30, 2015, which is hereby expressly incorporated by reference.

FIELD

Various features relate to improvements to cable management for equipment, such as rack mount equipment.

BACKGROUND

Rack-mounted describes a unit of electronic equipment that is housed in a metal framework called an equipment rack. Usually an equipment rack contains multiple "bays", each designed to hold enclosures or chassis containing a unit of equipment such as a computer server. Typically, the equipment unit, such as enclosures or chassis, is mounted (inserted into a bay in the rack) and secured in place with screws.

When the enclosures need to be serviced they are pulled out from the rack into a service position with the cabling still attached. However, with the increase in equipment densities in the racks and enclosures, less and less space is available for housing the cables which connect to the rear of the enclosures. Poor cable management can result in damaged cables and as a result increased time to add or change out cables. Furthermore, poor cable management can block critical airflow or access to the enclosures and equipment within the enclosures. As a result, inefficiencies in the performance of the equipment and/or downtime can occur.

Current cable management system include housing the service length of the cabling around the side and rear of the enclosure or housing the service length of the cabling in the rear of the enclosure using pivoting arm bars on which the cabling is routed in a serpentine fashion. Using the side of the enclosure to house the cabling is problematic as space to house the cabling is limited as the distance between the width of the mounting rails (450 mm in 19" racks) and the width of the enclosure (or chassis) is small. Furthermore, replacement of cables in a datacenter is difficult if not impossible as racks are located next to each other and access to the sides is not possible. Using pivoting arm bar for managing cabling is also problematic as the cabling usually has to enter all from one side of the rack instead of both, the serpentine path requires tight cable bend radii and open area needed for good airflow is blocked.

Consequently, a device for managing the cabling in rack mounted equipment that solves the aforementioned problems is needed.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one aspect, a cable management assembly is provided. The cable management system comprises one or more cable support members forming a helix, the one or more cable support members comprise a first plurality of segments secured together forming a first loop, the first plurality of segments including one or more planar segments and one or more curved segments; where at least one segment in the first plurality of segments includes one or more attachments points, the one or more attachment points are adapted to secure cabling to the one or more detachable cable support members; where the cable management assembly is operational between a first un-extended configuration and a second extended configuration; and where the cable management assembly stretches in the second extended configuration allowing attached cabling to be pulled out to a service length.

According to one feature, each segment in the plurality of segments is made from a material have spring properties and is flat.

According to another feature, the one or more cable support members includes a first attachment end and a second attachment member. The first attachment end is attached to an enclosure and the second attachment member is attached to a rear back plate assembly. The rear back plate assembly secured to a pair of back plate slide rail assemblies.

According to yet another feature, the rear back plate assembly is secured to the pair of back plate slide rail assemblies by detachable spring loaded hinges adapted to allow the rear back plate assembly and cable management assembly to detach and pivot away from one of the back plate slide rail assemblies in the pair of back plate slide rail assemblies. Each of the hinges comprises a first plate having a manually operated spring loaded latch secured to a side of the first plate, the manually operated spring loaded latch comprises a pair of pins connected to a spring; and a pair of handles connected to the pair of pins and the spring. Each of the hinges also comprises a second plate having a pair of housing members secured to a side of the second plate, the pair of housing members adapted to receive the pair of pins of the spring loaded latch. Squeezing the pair of handles together releases the pair of pins from the pair of housing members separating the first plate from the second plate.

According to yet another feature, the cable management assembly may further comprise a second plurality of segments secured together forming a second loop, the second plurality of segments including one or more planar segments and one or more curved segments. Each segment in the plurality of segments is flat.

According to yet another feature, the first loop has a first size and the second loop has a second size, wherein the first size is different from the second size.

According to yet another feature, the cable management assembly may further comprise a third plurality of segments secured together forming a third loop, the third plurality of segments including one or more planar segments and one or more curved segments. The third loop has a third size, wherein the third size is the same as the first size or the second size.

According to yet another feature, the one or more detachable cable support members alternate between loops of smaller sizes and larger sizes.

According to yet another feature, the one or more detachable cable support members include a plurality of loops where each consecutive loop in the plurality of loops decreases in size and the loops are formed in a nested configuration.

According to yet another feature, wherein the one or more attachment points are openings.

According to yet another feature, the cable support members are detachably secured together by screws.

DETAILED DESCRIPTION OF THE INVENTION

Figure 1:
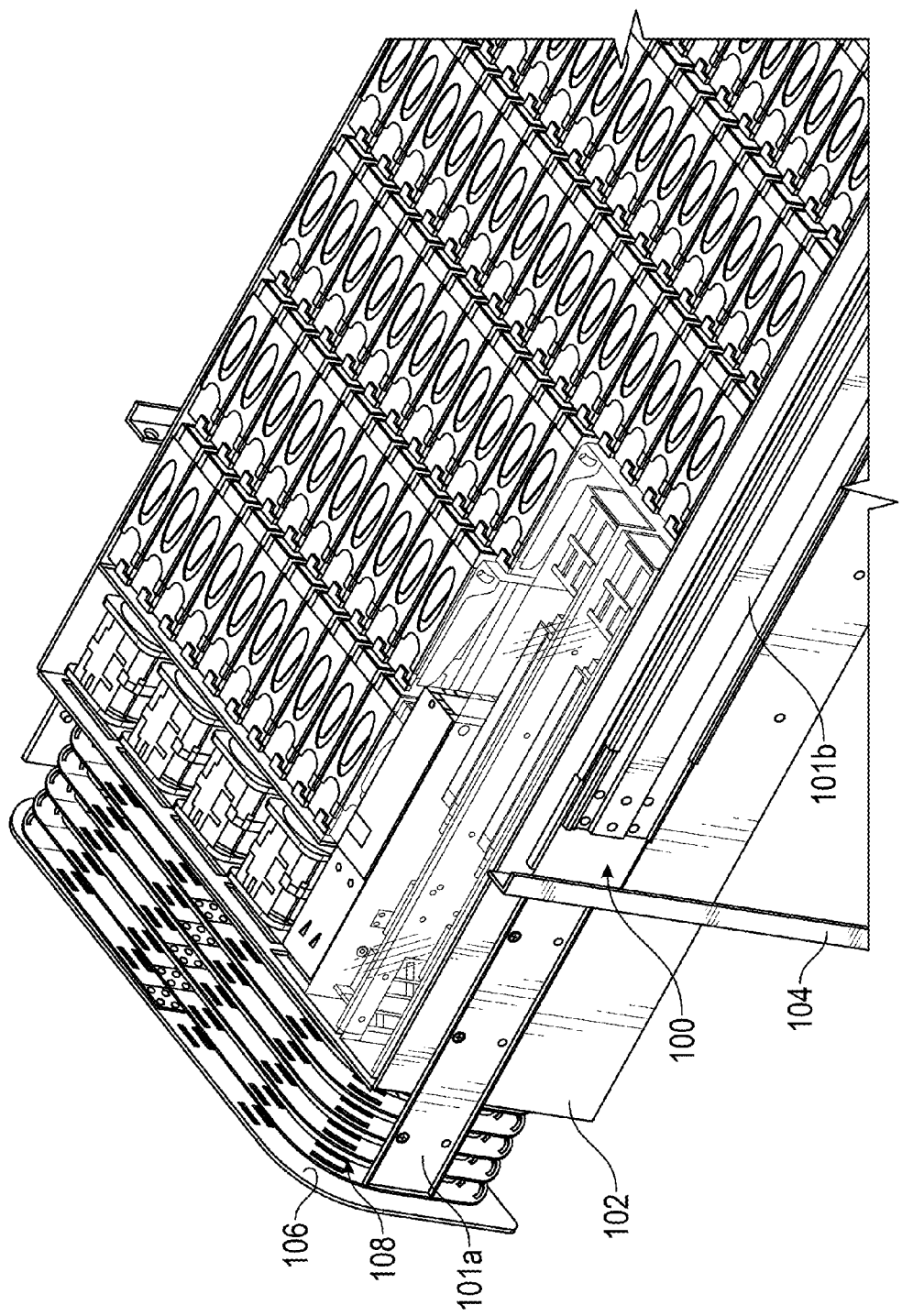
FIG. 1 illustrates a partial side perspective view of a cable management assembly at the rear of an enclosure in an equipment rack.

In the following detailed description, numerous specific details are set forth in order to provide a thorough understanding of the different aspects. However, it will be understood by one of ordinary skill in the art that the different aspects may be practiced without these specific details. For example, well-known operations, structures and techniques may not be shown in detail in order not to obscure the different aspects presented herein.

In the following description, certain terminology is used to describe certain features of one or more embodiments.

The term "rack" may refer to any type of frame-like structure adapted to hold and display equipment. The term "enclosure" may refer to a chassis for storing data storage drives (or "drives") mounted or inserted into a rack mount type storage unit, or any other type of equipment that may be mounted or inserted into a rack mount type storage unit. The term "data storage drive" may refer to a hard disk drive (HDD), a solid state drive or any type of drive for storing data.

The term "attachment point" may refer to any opening through a structure and/or component used to secure cabling including but not limited to holes, apertures, passages, slits and slots. The term "fastener" or "fastening member" may refer to any type of device for connecting metal, plastic and other materials in common hardware construction, including but not limited to screws, bolts, nuts, washers, rivets, cotter pins, clevis pins, studs, threaded rods and other mechanical connectors.

Although the cable management assembly of the present disclosure may be employed in a variety of different rack mounting structures, the cable management assembly is shown in use with a typical rack structure that may include four vertical corner posts where each of the posts has a vertical series of holes formed therein. The vertical series of holes is provided so that slide rail assemblies or trays may be mounted at a number of different heights in the rack, thereby forming numerous slots for enclosures and supporting them in a stacked arrangement.

Although the present disclosure is described with the cable management assembly, adapted to receive cabling secured thereon, located in the rear of the enclosures, chassis or equipment being pulled out the front of the rack for servicing, this is by way of example only. The cable management system may be located on a side of the enclosures, chassis or equipment.

While the present disclosure is described primarily with respect to a cable management system for an enclosure in an equipment rack, the present disclosure may be applied and adapted to various applications. The present invention may be applied to any type of equipment having cabling stored in any location.

Overview

According to one aspect, a cable management assembly for managing cabling in an equipment rack is provided. The cable management assembly may be utilized to manage the movement of cables attached to the enclosures when the enclosures are pulled into and out of the front of the equipment rack during servicing.

According to another aspect, the cable management assembly may be disposed behind a slidingly mounted enclosure in a rack mount equipment structure.

According to one aspect, the enclosures remain connected to the cabling and operational when the enclosures are pulled out of the rack structure for service and maintenance. That is, the cable management assembly disclosed herein allows for the enclosure to be pulled from an operational position to a service position with cabling still attached.

According to yet another aspect, all the service cabling lengths may be housed at the rear of an enclosure behind the rear rack mounting rails without the need to use the sides of the enclosure or chassis for any service cabling lengths.

According to yet another aspect, the cable management assembly may comprise a plurality of detachable cable support members or loops having varying sizes. In one example, the cable management assembly may have a first set of loops having a first size and a second set of loops having a second size where the first size is larger than the second size allowing for the loops to be nested. Nesting of the loops in the cable management assembly allows the depth needed for the cable management assembly to be reduced.

According to yet another aspect, the cable management assembly may be scalable for the service extension length needed.

According to yet another aspect, the cable management assembly may provide for a large center area which is open allowing for good airflow through the enclosure and equipment rack.

According to yet another aspect, the cable management assembly may maintain a large bend radii for cables.

According to yet another aspect, the detachable cable support members may come in single half loops that may be fastened together, as described in more detail below, allowing a user to assemble a cable management assembly on site for customization of each use based on the size of the enclosure. Alternatively, the cable management assembly may come in a pre-determined sized with a pre-determined number of loops.

Cable Management Assembly

Figure 2:
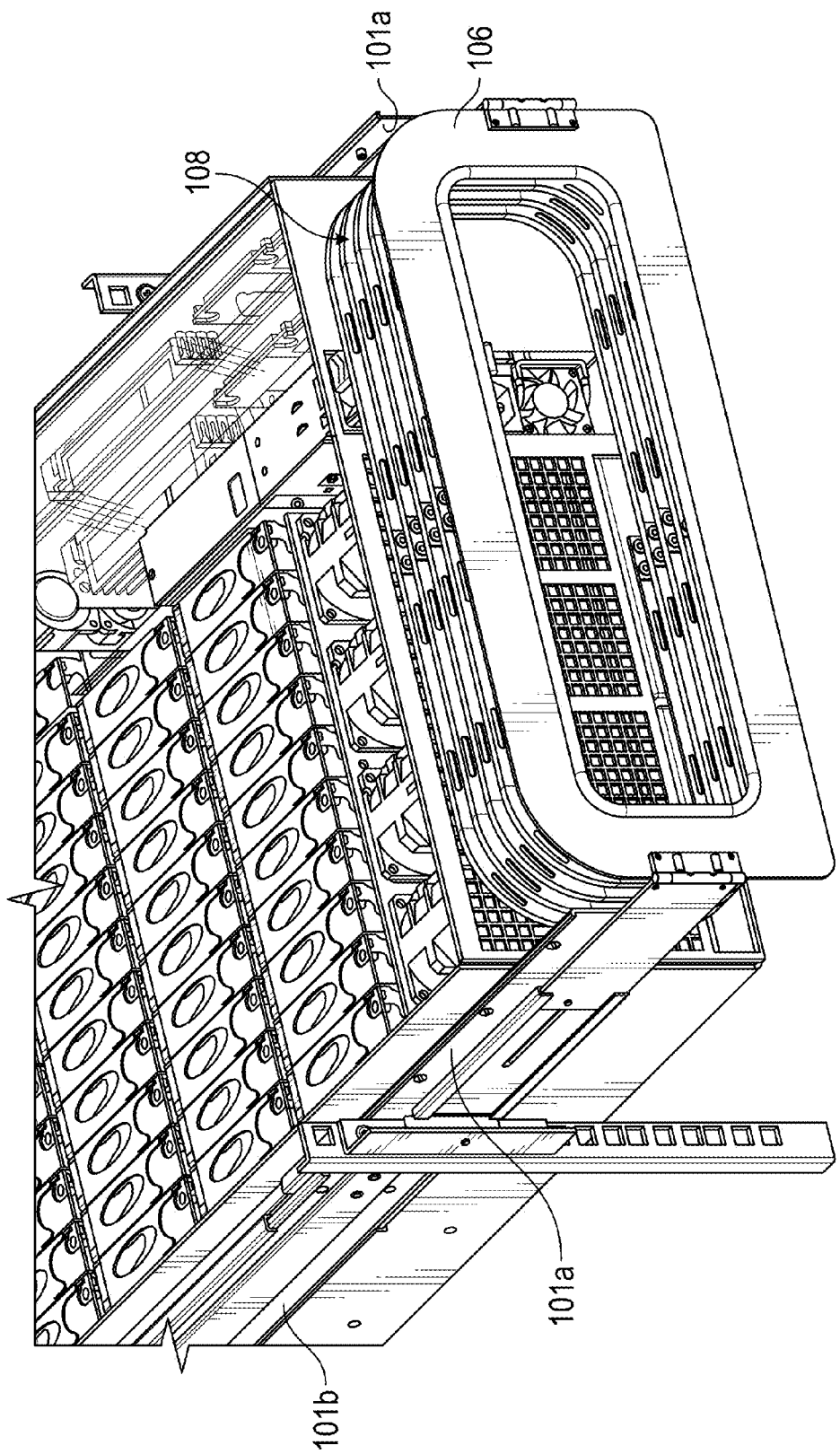
FIG. 2 illustrates a partial top rear perspective view of a cable management assembly secured to a telescoping back plate slide rail assembly in an equipment rack.
Figure 3:
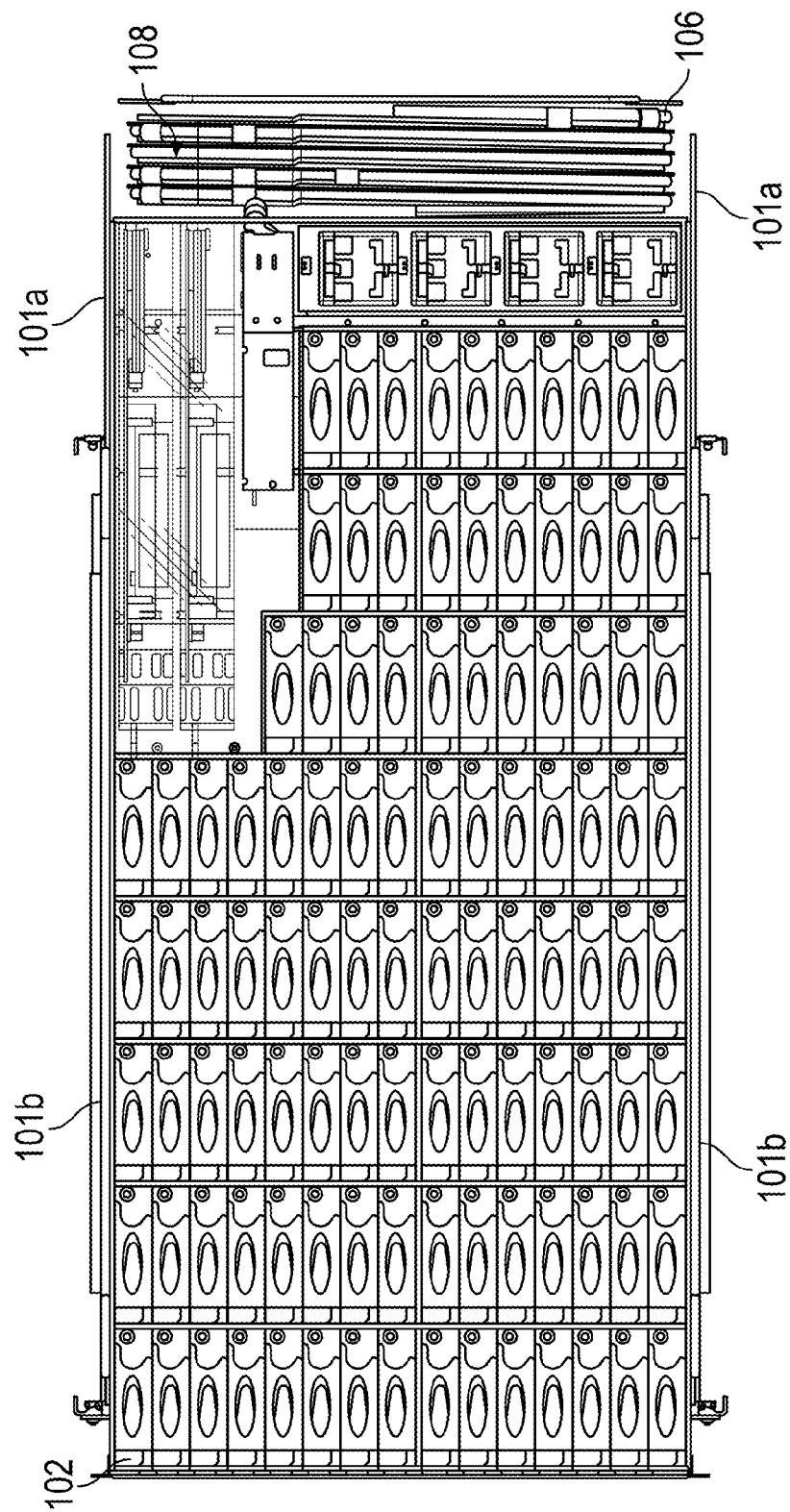
FIG. 3 illustrates a top plan view of a cable management assembly at the rear of an enclosure in an equipment rack.
Figure 4:
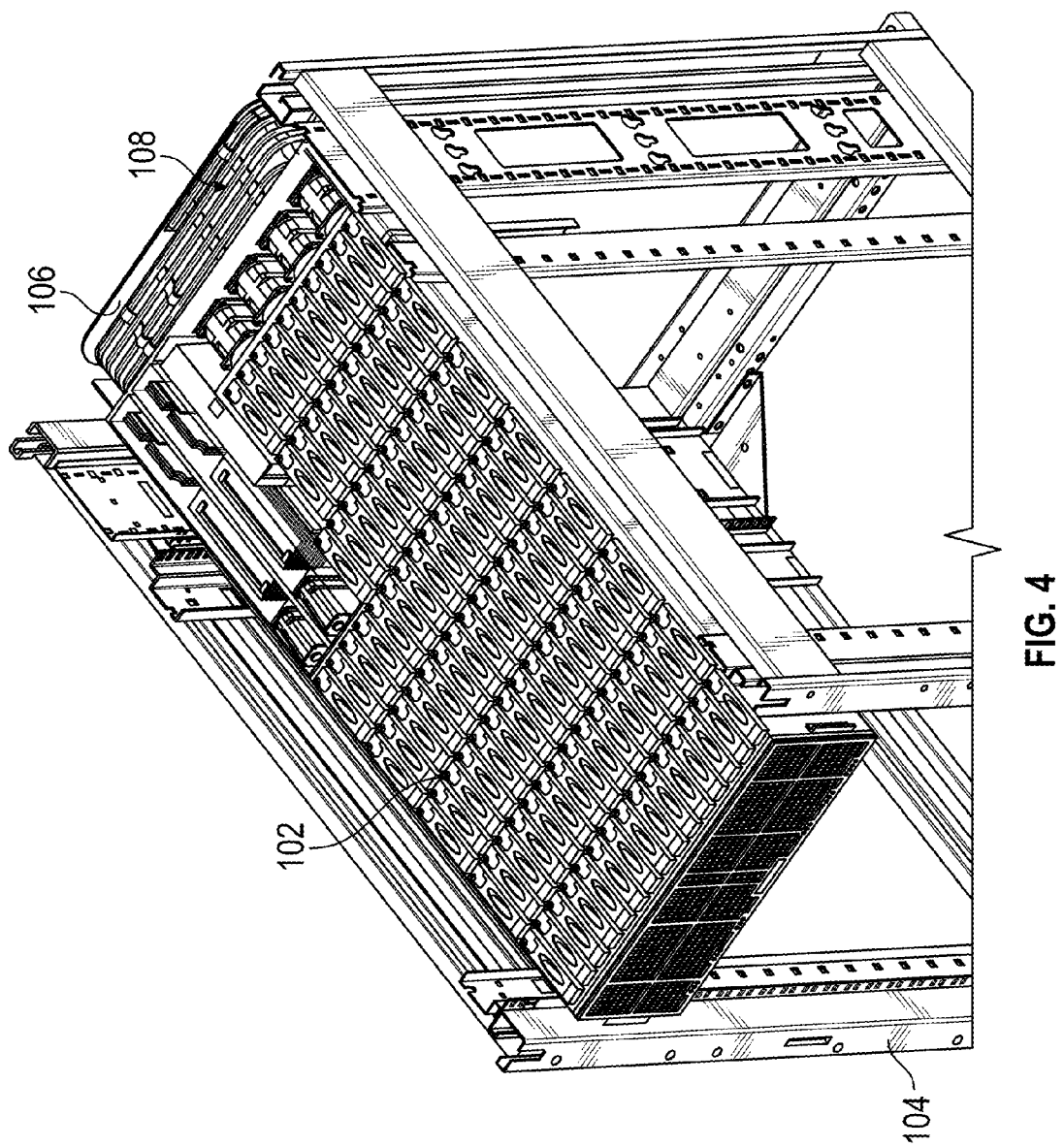
FIG. 4 illustrates a top front perspective view of a cable management assembly at the rear of an enclosure in an equipment rack.
Figure 5:
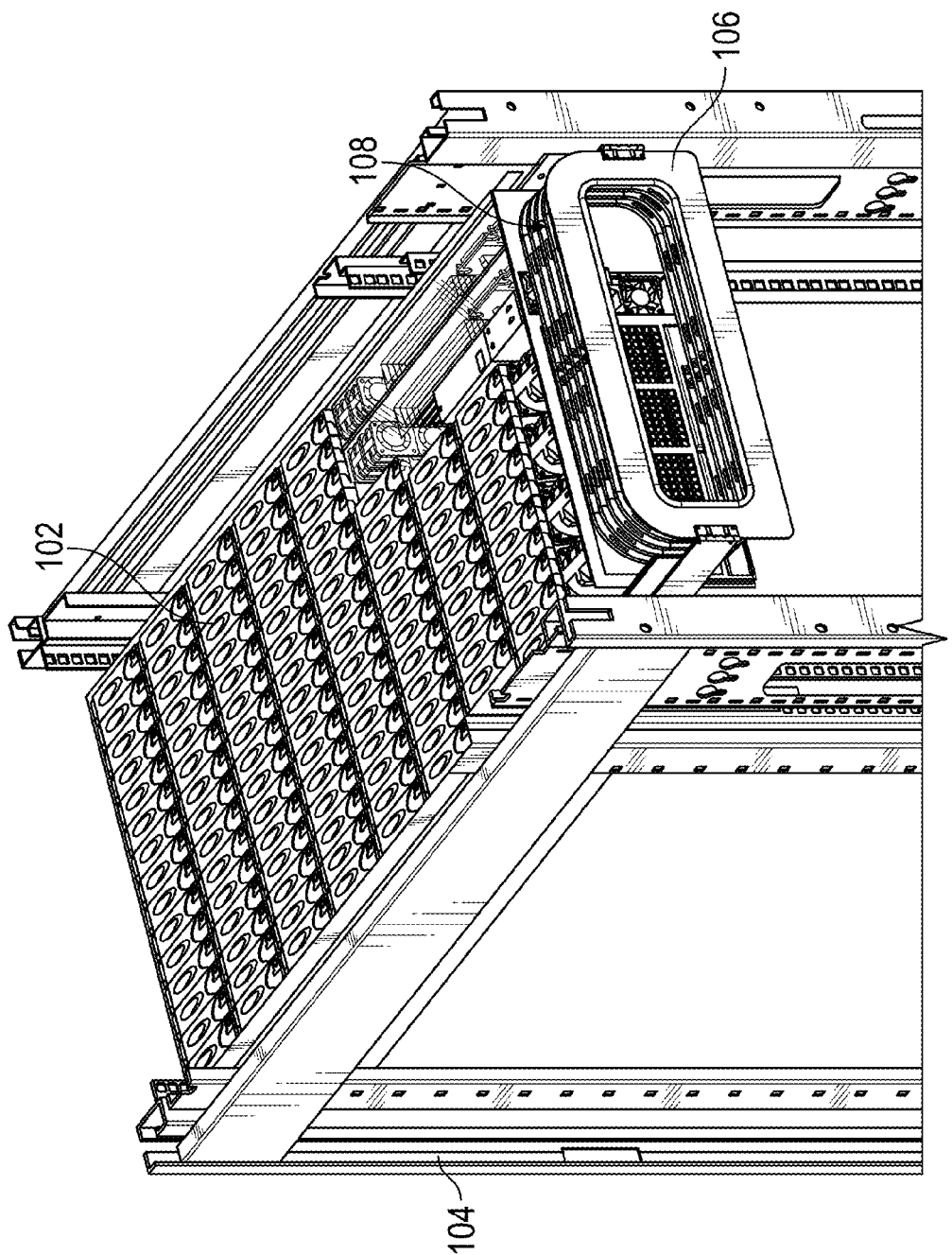
FIG. 5 illustrates a top rear perspective view a cable management assembly secured to a telescoping back plate slide rail assembly in an equipment rack.
Figure 6:
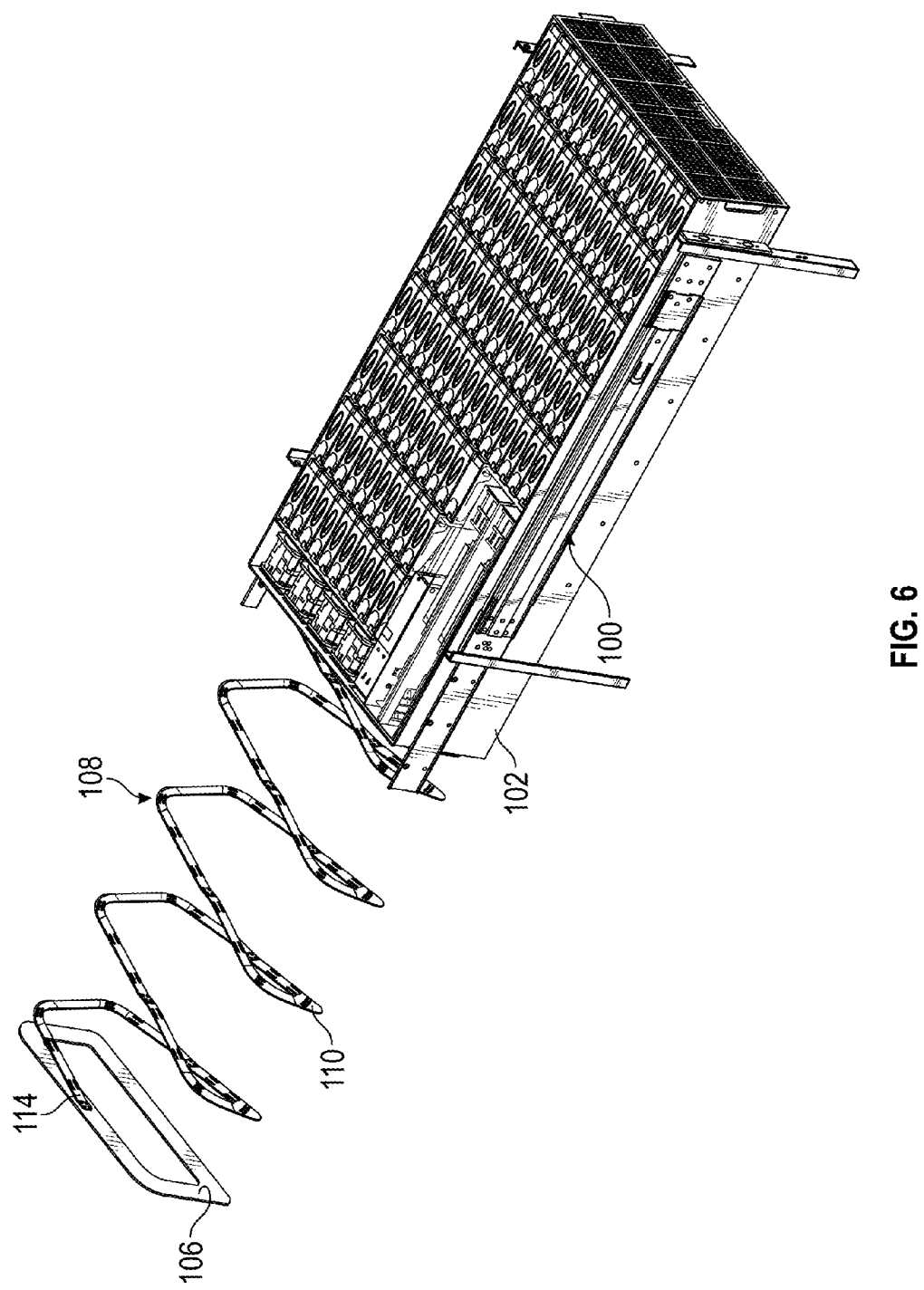
FIG. 6 illustrates a side perspective view of a cable management assembly at the back of an enclosure in an equipment rack in an extended configuration.
Figure 7:
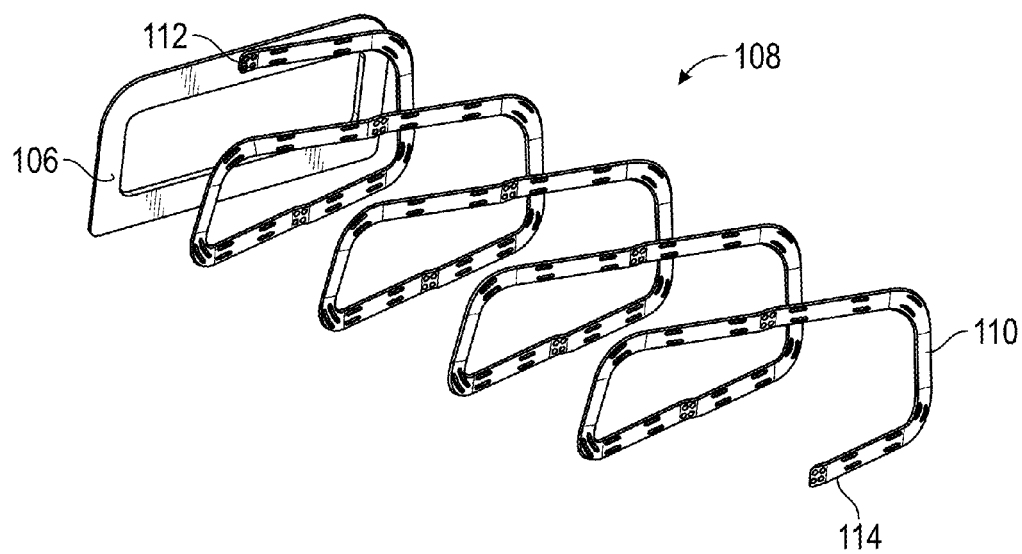
FIG. 7 illustrates a side perspective view of a cable management assembly in an open or extended configuration.
Figure 8:
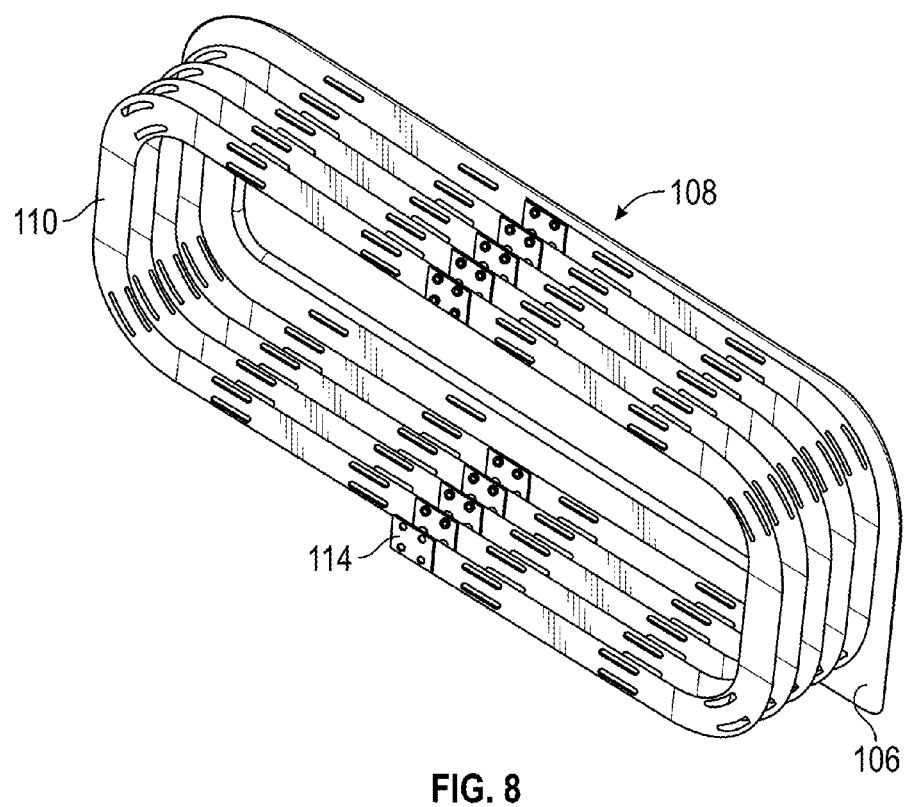
FIG. 8 illustrates a side perspective view of a cable management assembly in a closed or un-extended configuration.
Figure 9:
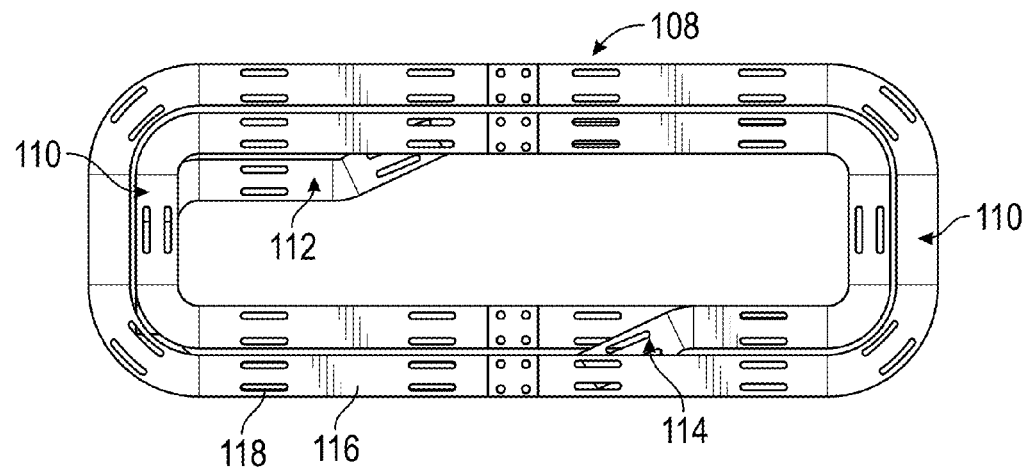
FIG. 9 illustrates a front plan view of a nested cable management assembly in a closed or un-extended configuration.
Figure 10:
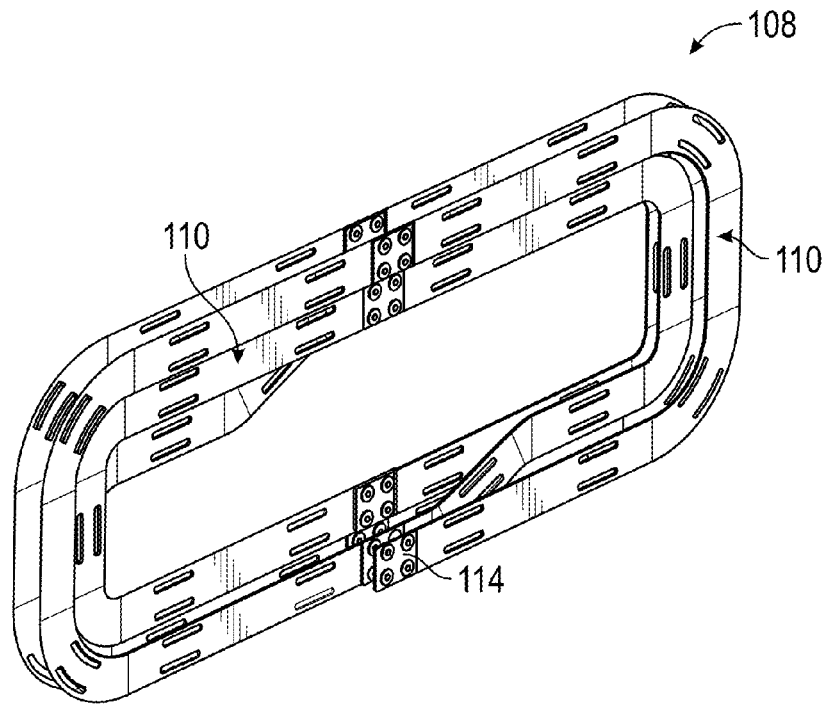
FIG. 10 illustrates a front perspective view of a nested cable management assembly in a closed or un-extended configuration.
Figure 11:
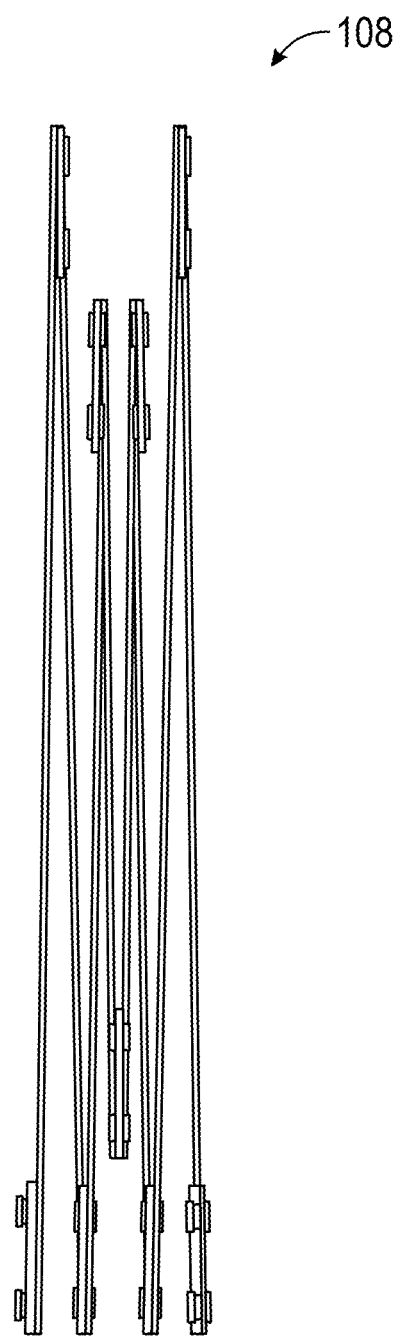
FIG. 11 illustrates a side elevation view of a nested cable management assembly in a closed or un-extended configuration.

FIG. 1 illustrates a partial side perspective view of a cable management assembly at the rear of an enclosure in an equipment rack. FIG. 2 illustrates a partial top rear perspective view of a cable management assembly secured to a telescoping back plate slide rail assembly in an equipment rack. FIG. 3 illustrates a top plan view of a cable management assembly at the rear of an enclosure in an equipment rack. FIG. 4 illustrates a top front perspective view of a cable management assembly at the rear of an enclosure in an equipment rack. FIG. 5 illustrates a top rear perspective view a cable management assembly secured to a telescoping back plate slide rail assembly in an equipment rack. FIG. 6 illustrates a side perspective view of a cable management assembly at the back of an enclosure in an equipment rack in an extended configuration. FIG. 7 illustrates a side perspective view of a cable management assembly in an open or extended configuration. FIG. 8 illustrates a side perspective view of a cable management assembly in a closed or un-extended configuration. FIG. 9 illustrates a front plan view of a nested cable management assembly in a closed or un-extended configuration. FIG. 10 illustrates a front perspective view of a nested cable management assembly in a closed or un-extended configuration. FIG. 11 illustrates a side elevation view of a nested cable management assembly in a closed or un-extended configuration. The following discussion refers interchangeably to FIGS. 1-11.

As shown, a telescoping slide rail assembly 100 is utilized to mount an enclosure 102 in an equipment rack 104. The telescoping slide rail assembly 100 may include stationary slide rails 100a, adapted for engaging a pair of vertical upright members (or vertical corner posts) that form the rack, and mounting slide rails 100b operatively coupled to the stationary slide rails 100a so that the mounting slide rails 100b are movable relative to the stationary slide rails 100a between a fully extended position and a fully retracted position.

A rear back plate assembly 106 may be attached to the equipment rack as described in further detail below with reference to FIGS. 12-16. The rear back plate assembly 106 may be used to support a cable management assembly 108. The cable management assembly 108 may comprise one or more detachable cable support members 110 (See FIG. 10) that form a helix having a first attachment end 112 and a second attachment end 114. (See FIGS. 7-8) The first attachment end 112 may be attached to the stationary rear back plate assembly 106 and the second attachment end 114 may be attached to the rear of the enclosure.

According to one aspect, the detachable cable support members 110 may include a plurality of segments 116 having a generally flat configuration. As shown in FIG. 9, the segments 116 may have a generally elongated planar (i.e. located in a horizontal plane, such as rectangular, configuration or a curved configuration. A combination of planar, such as rectangular, and curved segments 116 may be secured together, by any means known in the art, forming a loop. A plurality of loops 110 may be secured together forming the assembly 108. The loops 110 may be secured together by any means known in the art. Although the segments are shown as rectangular and curved, the segments may be formed of any polygonal or non-polygonal shape. The detachable cable support members 110 may come in single half loops that may be fastened together allowing a user to assemble the cable management assembly on site for customization of each use based on the size of the enclosure. That is, the number of loops or half loops that are needed based on the length of the particular cable may be secured together by any fastener or fastening means known in the art. Alternatively, the cable management assembly may come in a pre-determined sized with a pre-determined number of loops.

The detachable cable support members or loops 110 of varying size. In one configuration smaller loops may be alternated with larger loops such that the smaller loops can nest within the larger loops for additional space saving. For example four (4) loops can be secured together that only require approximately the depth space of the two larger loops. Alternatively, loops can be made with decreasing loop sizes (rectangular cone) so that all loops may collapse into a single loop thickness.

According to one aspect, the segments 116 may include one or more attachment points 118, such as openings, which may be used to secure cabling to the assembly 108. For example, cable ties may be inserted into the attachment points 118 for securing cabling to the attachment points 118 on the segments of the assembly 108. In one example, a hook and loop fastener may be used to secure cabling to the attachment points 118. Alternatively, a wire, pin or any other method known in the art may be utilized to secure cabling to the attachment points 118. Thus, the cabling may follow the loops attaching at attachment points as needed. Although the attachment points 118 are shown as elongated slits, this is by way of example only and the attachments points may be of any shape.

According to one aspect, the loops 110 may be detachably coupled to each other providing for a scalable cable management assembly 108. Consequently, the length as well as the depth of the cable management assembly 108 may be tailored for each specific enclosure and equipment rack. Furthermore, the cable management assembly 108 may be adjusted during installation or service or maintenance of the enclosure. As described above, the loops or detachable cable support members 110 may come in single half loops that may be fastened together allowing a user to assemble the cable management assembly on site for customization of each use based on the size of the enclosure. Each half loop or loop may be secured to another half loop or loop by rivets, screws, bolts or any other type of fastener known in the art.

According to one aspect, each of the segments 118 may be flexible and have a spring like property. When the enclosure 102 is pulled out of the equipment rack 104, the enclosure 102 may pull on the second attachment end 114 (attached to the back of the enclosure) of the cable management assembly 108 stretching the cable management assembly 108 allowing the cabling attached to the cable management assembly to be pulled out to the service length required, similar to an extension spring as it is pulled. (See FIG. 6) In one configuration, the cable management assembly 108 may be allowed to extend through the torsion of the material of the one or more detachable cable support members 110 (spring like quality). In another configuration, the cable management assembly 108 may extend as a result of rotating pivots on the sides of the one or more detachable cable support members 110, the rotating pivots used to secure or fasten each loop or half loop in the cable management assembly together.

Rear Back Plate Assembly

Figure 12:
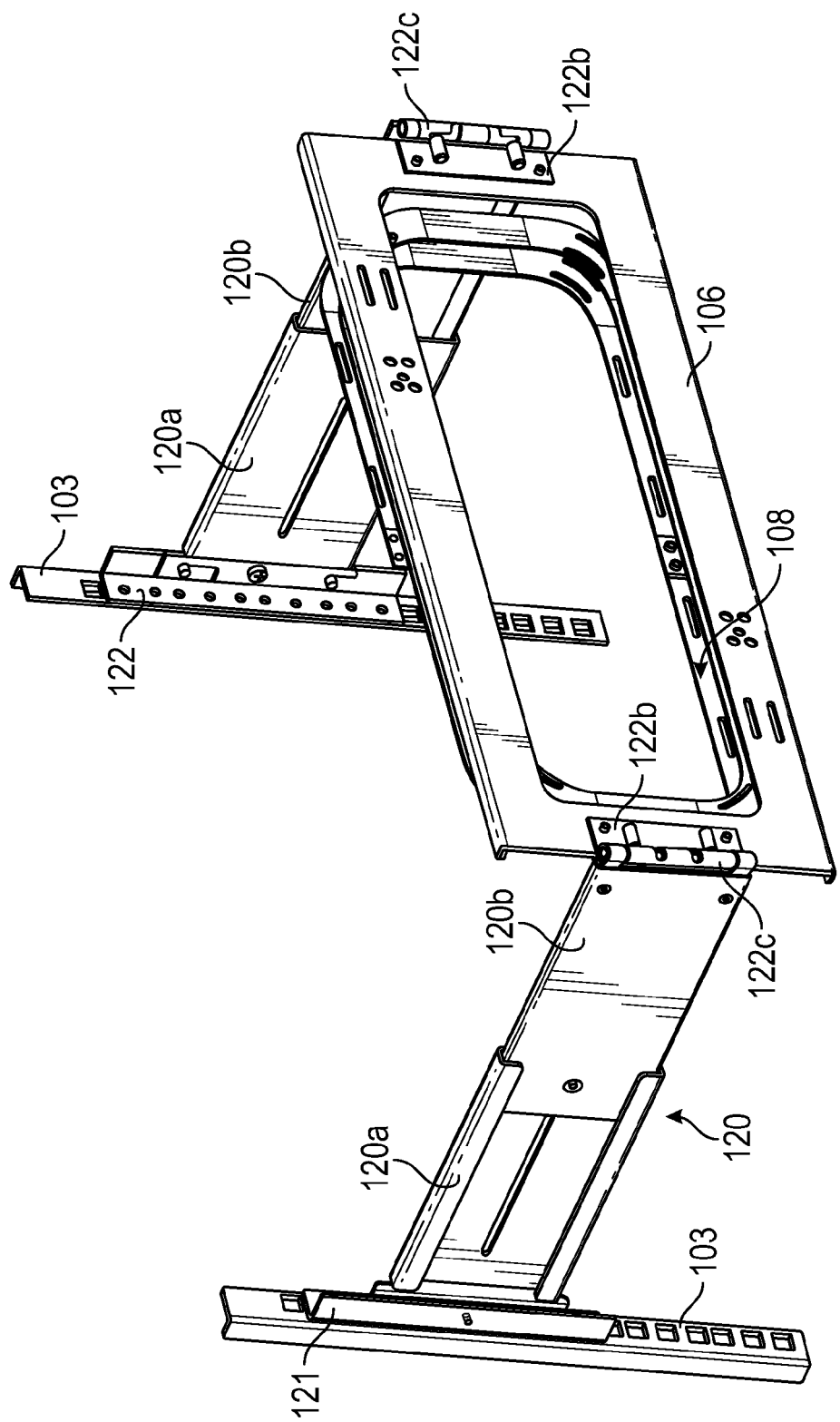
FIG. 12 illustrates a cable management assembly secured to an equipment rack by a telescoping back plate slide rail assembly.
Figure 13:
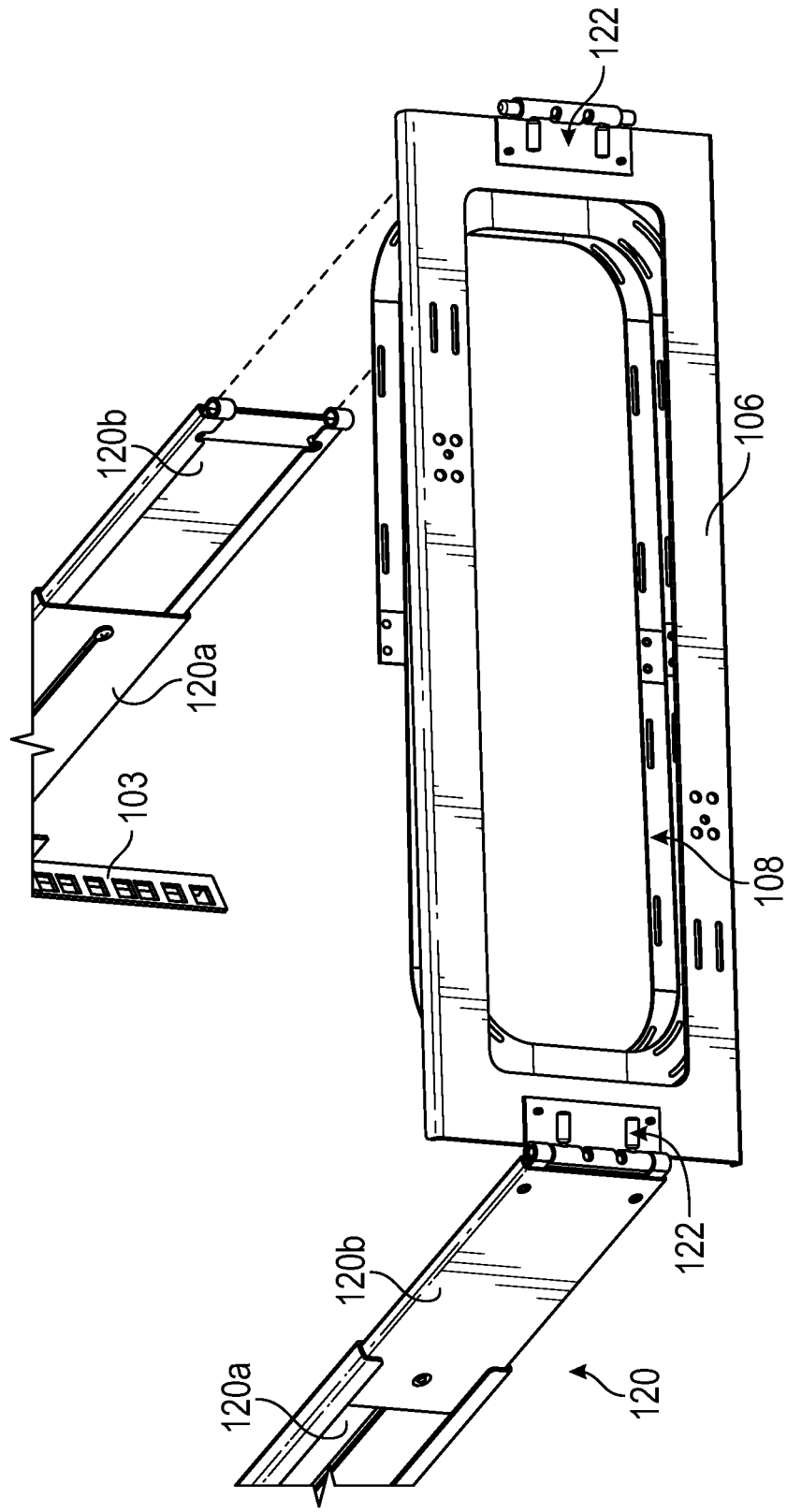
FIG. 13 illustrates the cable management assembly of FIG. 12 in a pivotally opened configuration.
Figure 14:
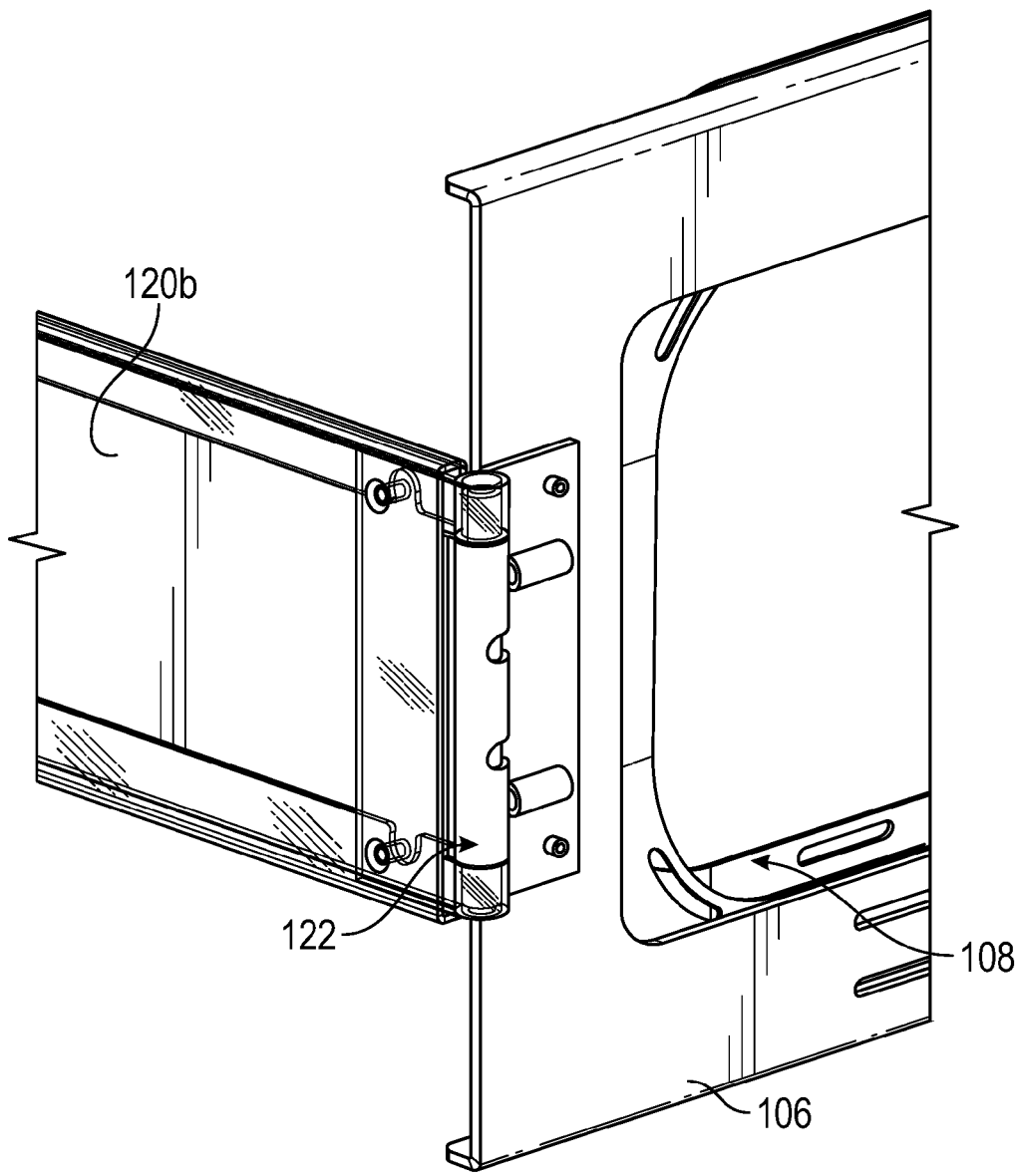
FIG. 14 illustrates is a close up view of a hinge securing the cable management assembly to the telescoping back plate slide rail assembly.
Figure 15:
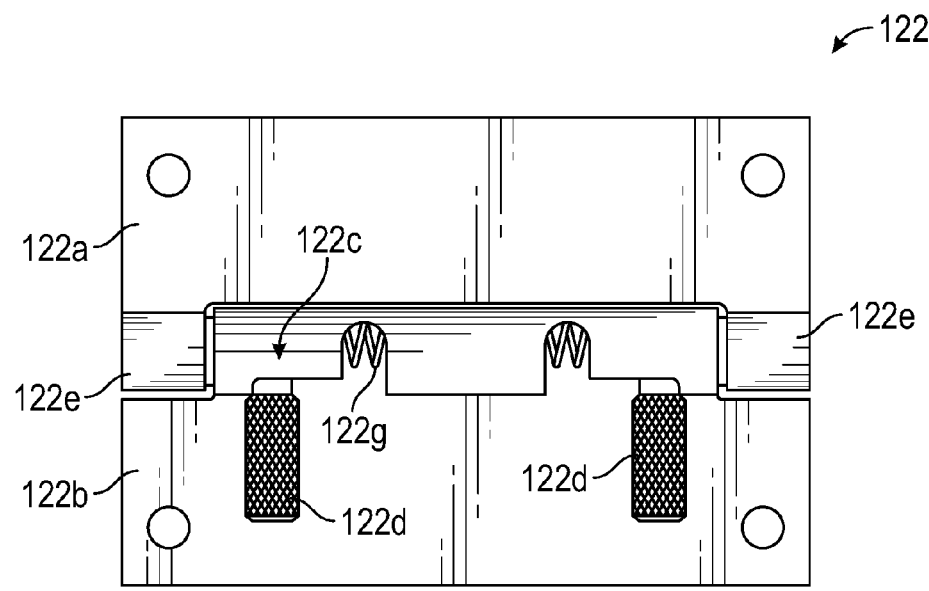
FIG. 15 illustrates a hinge used to secure a cable management assembly to an enclosure of equipment rack.
Figure 16:
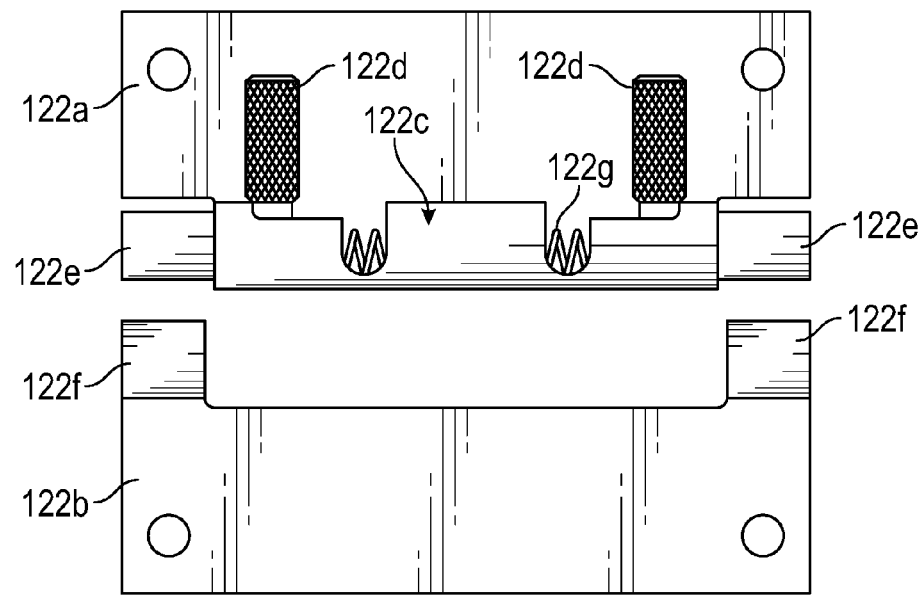
FIG. 16 illustrates the hinge of FIG. 15 in an uncoupled configuration.

FIGS. 12-14 illustrate the rear back plate assembly 106 attached to the equipment rack. The rear back plate assembly 106 may be detachably secured to the equipment rack 104 by a telescoping back plate slide rail assembly 120 and a hinge 122. The telescoping back plate slide rail assembly 120 may include back plate stationary slide rails 120a operatively coupled to back plate mounting slide rails 120b so that the mounting slide rails 120b are movable relative to the back plate stationary slide rails 120a between a fully extended position and a fully retracted position. The back plate stationary slide rails 120a may be adapted for engaging a pair of upright members or vertical members 103 of an equipment rack using brackets 121. Although L-Shaped brackets are shown, this is by way of example only and any type of bracket or securing means known in the art may be utilized.

The rear back plate assembly 106 may be pivotally connected to the back plate stationary slide rails 120a of the telescoping back plate slide rail assembly 120 by a detachable spring loaded hinge 122. According to one embodiment, the rear back plate assembly 106 may pivot anywhere from 0 degrees to 90 degrees from the telescoping back plate slide rail assembly 120. The hinge may be secured or fastened onto the rear back plate assembly 106 and the back plate mounting slide rails 120b by screws, rivets or any other type of fastener or fastening means known in the art. The hinge 122 may include a first plate 122a having a manually operated spring loaded latch 122c connected on one side and a second plate 122b having a pair of housing members 122f secured to a side of the second plate 122b. The spring loaded latch 122c may comprise a pair of pins 122e connected to a spring 122g and a pair of handles 122d connected to the pair of pins 122e and the spring 122g. The pair of housing members 122f of the second plate may be adapted to receive the pair of pins 122e of the manually operated spring loaded latch 122c.

Depressing or squeezing together the handles 122d on the spring loaded latch 122c causes the pair of pins 122e to retract from housing members 122f, such as elongated cylinders, in the first plate 122a allowing the first plate 122a to be detached from the second plate 122b. (See FIGS. 15-16) This allows a user to pivotally open one side of the rear back plate assembly 106 from the enclosure for repair or maintenance. (See FIG. 13) Additionally, both hinges may be uncoupled or removed allowing the entire rear back plate assembly 106 to be removed.

The hinge 122 described above is by way of example only and any type of hinge, fastener or other connecting member or means known in the art may be utilized to attach the rear back plate assembly to the equipment rack.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A cable management assembly, comprising:
   a plurality of detachable cable support members forming a helix, the plurality of detachable cable support members comprising:
   a first plurality of segments secured together forming a first loop, the first plurality of segments including one or more planar segments and one or more curved segments;
   where at least one segment in the first plurality of segments includes one or more attachments points, the one or more attachment points adapted for securing cabling to the plurality of detachable cable support members;
   where the cable management assembly is operational between a first un-extended configuration and a second extended configuration; and
   where the cable management assembly stretches in the second extended configuration allowing secured cabling to be pulled out to a service length.

2. The cable management assembly of claim 1, wherein each segment in the plurality of segments is made from a material have spring properties.

3. The cable management assembly of claim 1, wherein each segment in the plurality of segments is flat.

4. The cable management assembly of claim 1, wherein the plurality of cable support members includes a first attachment end and a second attachment member.

5. The cable management assembly of claim 4, wherein the first attachment end is attached to an enclosure and the second attachment member is attached to a rear back plate assembly.

6. The cable management assembly of claim 5, wherein the rear back plate assembly secured to a pair of back plate slide rail assemblies.

7. The cable management assembly of claim 6, wherein the rear back plate assembly is secured to the pair of back plate slide rail assemblies by a plurality of detachable spring loaded hinges adapted to allow the rear back plate assembly and cable management assembly to detach and pivot away from one of the back plate slide rail assemblies in the pair of back plate slide rail assemblies.

8. The cable management assembly of claim 7, wherein each of the plurality of detachable hinges comprises:
   a first plate having a manually operated spring loaded latch secured to a side of the first plate, the manually operated spring loaded latch comprising:
   a pair of pins connected to a spring; and
   a pair of handles connected to the pair of pins and the spring; and
   a second plate having a pair of housing members secured to a side of the second plate, the pair of housing members adapted to receive the pair of pins of the spring loaded latch.

9. The cable management assembly of claim 8, wherein squeezing the pair of handles together releases the pair of pins from the pair of housing members separating the first plate from the second plate.

10. The cable management assembly of claim 1, further comprising a second plurality of segments secured together forming a second loop, the second plurality of segments including one or more planar segments and one or more curved segments.

11. The cable management assembly of claim 10, wherein each segment in the plurality of segments is flat.

12. The cable management assembly of claim 10, further comprising a third plurality of segments secured together forming a third loop, the third plurality of segments including one or more planar segments and one or more curved segments.

13. The cable management assembly of claim 12, wherein the third loop has a third size, wherein the third size is the same as the first size or the second size.

14. The cable management assembly of claim 13, wherein the plurality of detachable cable support members alternate between loops of smaller sizes and larger sizes.

15. The cable management assembly of claim 13, wherein the plurality of detachable cable support members include a plurality of loops where each consecutive loop in the plurality of loops decreases in size.

16. The cable management assembly of claim 13, wherein the plurality of loops are formed in a nested configuration.

17. The cable management assembly of claim 1, wherein the one or more attachment points are openings.

18. The cable management assembly of claim 1, wherein the cable support members are detachably secured together by screws.

* * * * *